(12) United States Patent
Nishikubo et al.

(10) Patent No.: US 7,132,168 B2
(45) Date of Patent: *Nov. 7, 2006

(54) RESIN CURABLE WITH ACTINIC RADIATION, PROCESS FOR THE PRODUCTION THEREOF, AND PHOTOCURABLE AND THERMOSETTING RESIN COMPOSITION

(75) Inventors: Tadatomi Nishikubo, Fujisawa (JP); Atsushi Kameyama, Yokohama (JP); Masaki Sasaki, Asaka (JP); Masatoshi Kusama, Sakaido (JP)

(73) Assignees: Kanagawa University (JP); Taiyo Ink Manufacturing Co., Ltd. (JP)

( * ) Notice: Subject to any disclaimer, the term of this patent is extended or adjusted under 35 U.S.C. 154(b) by 0 days.

This patent is subject to a terminal disclaimer.

(21) Appl. No.: 11/010,294

(22) Filed: Dec. 14, 2004

(65) Prior Publication Data

US 2005/0100822 A1     May 12, 2005

Related U.S. Application Data

(60) Division of application No. 10/256,021, filed on Sep. 27, 2002, now Pat. No. 6,861,500, which is a continuation of application No. PCT/JP01/02487, filed on Mar. 27, 2001, now abandoned.

(30) Foreign Application Priority Data

Mar. 29, 2000  (JP) .............................. 2000-90897
Dec. 7, 2000  (JP) .............................. 2000-373400

(51) Int. Cl.
B32B 27/38  (2006.01)

(52) U.S. Cl. ...................... 428/414; 528/406; 528/408; 526/319; 428/500; 428/416

(58) Field of Classification Search ................ 428/414, 428/416, 500; 528/406, 408; 526/319
See application file for complete search history.

(56) References Cited

U.S. PATENT DOCUMENTS 6,867,282 B1 *  3/2005  Nishikubo et al. .......... 528/408

FOREIGN PATENT DOCUMENTS

| JP | 2-297558 | 12/1990 |
| JP | 3-205404 | 9/1991 |
| JP | 4-348146 | 12/1992 |
| JP | 5-202317 | 8/1993 |
| JP | 9-179299 | 7/1997 |
| JP | 9-241579 | 9/1997 |
| JP | 11-269211 | 10/1999 |
| WO | 97/16470 | * 5/1997 |

OTHER PUBLICATIONS

Tadatomi Nishikubo & Nazuya Sato, New Addition Reactions of Cyclic Ethers with Esters and Thioesters Catalyzed by Quatemary Ammonium Salts or Crown Ether Complexes. Chemistry Letters, pp. 697-700, 1991.

Tadatomi Nishikubo , Astsushi Kameyama, Akira Suski, A Novel synthesis of polyesters with pendant hydroxl groups by polyaddition of bis (oxtenane) with dicarboxylic acids catalyzed by quaternary onium salts. Reactive & Functional Polymers 37 (1998) 19-25.

Tadatomi Nishikubo, Astsdushi Kameyama, Muneharu Ito, Tomoe Nakajima, Haruo Miyaazaki, A Novel Synthesis of Polyethers with Pendant Hydroxyl Groups by Polyaddition of Bis (oxetane)s with Bis (phenol)s, Journal of Polymer Science, Part A, Polymer Chemistry, vol. 37. 2781-2790 (1999).

* cited by examiner

Primary Examiner—Kuo-Liang Peng
(74) Attorney, Agent, or Firm—Rader Fishman & Grauer; Ronald P. Kananen

(57) ABSTRACT

A printed circuit board that includes a solder resist has a photocurable and thermosetting resin composition which comprises (A) an actinic energy ray-curable resin having at least one structure represented by the following general formula (1), (B) a polymerization initiator, (C) a diluent, and (D) a polyfunctional oxetane compound. The actinic energy ray-curable resin mentioned above can be produced by causing the reaction of (a) a polyfunctional oxetane compound with (b) an unsaturated monocarboxylic acid and the subsequent reaction of (c) a polybasic acid anhydride with a primary hydroxyl group of the resultant modified oxetane resin (a').

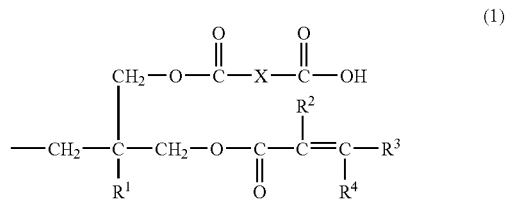

(1)

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

5 Claims, 1 Drawing Sheet

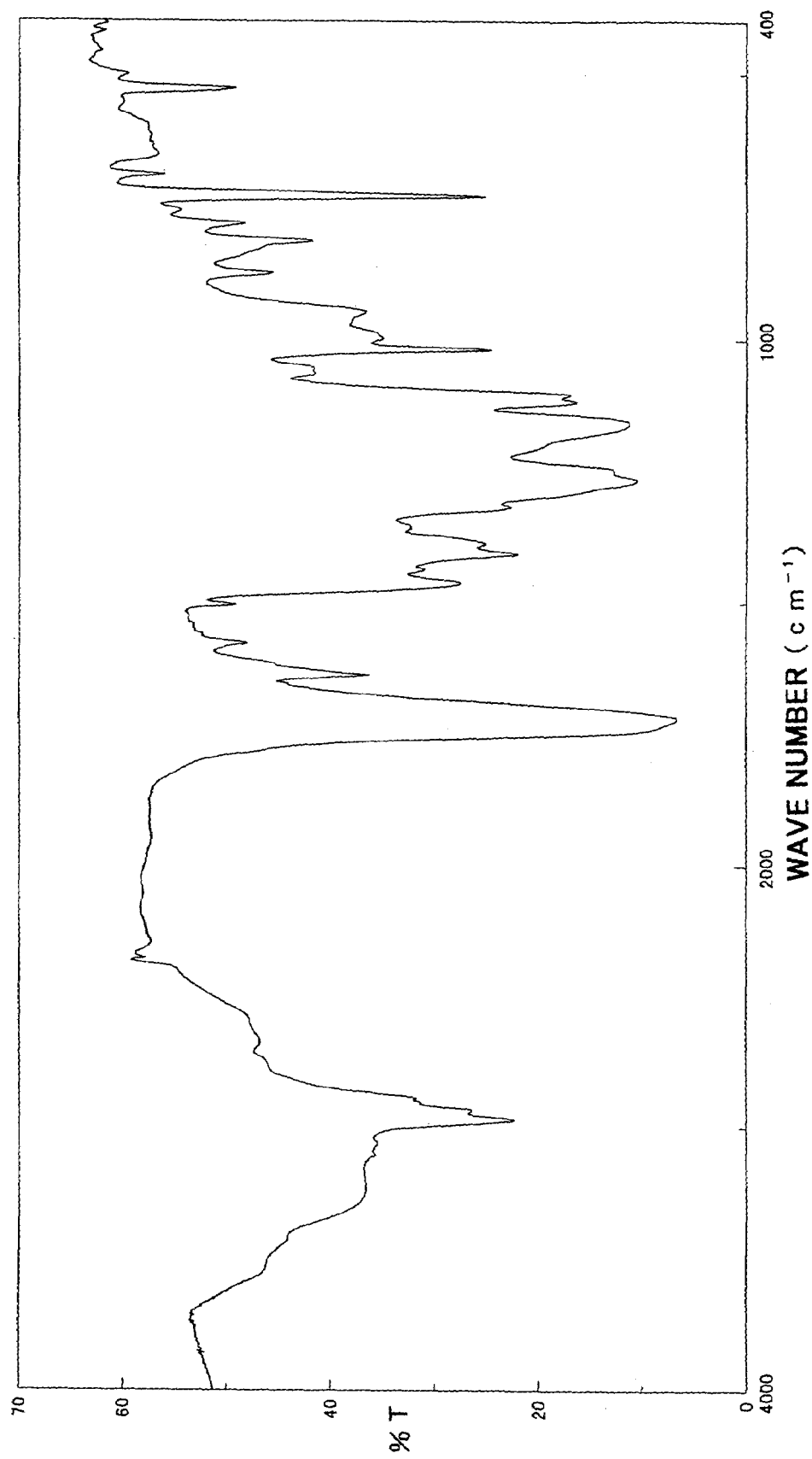

RESIN CURABLE WITH ACTINIC RADIATION, PROCESS FOR THE PRODUCTION THEREOF, AND PHOTOCURABLE AND THERMOSETTING RESIN COMPOSITION

CROSS-REFERENCE TO RELATED APPLICATIONS

The present application is a Divisional Application of the patent application Ser. No. 10/256,021, filed on Sep. 27, 2002, now U.S. Pat. No. 6,861,500 which is a continuation of application No. PCT/JP01/02487, filed Mar. 27, 2001, the entire contents of which are incorporated herein by reference.

BACKGROUND OF THE INVENTION

1. Field of the Invention

This invention relates to a novel resin curable with an actinic energy ray and a method for the production thereof, more particularly relates to an actinic energy ray-curable resin which is soluble in an aqueous alkaline solution and capable of producing a film excelling in resistance to heat, electrical insulation properties, etc and a method for the production thereof.

This invention further relates to a photocurable and thermosetting resin composition which can be developed with an aqueous alkaline solution, contains the actinic energy ray-curable resin as mentioned above and hardens promptly by irradiation of an actinic energy ray such as an ultraviolet ray or an electron beam or further hardens by heating, more particularly relates to a photocurable and thermosetting resin composition which is excellent in storage stability, capable of producing a cured film excelling in resistance to heat, adhesiveness, electrical insulation properties, etc. without causing cracks, and adoptable in various application fields such as a solder resist to be used in the production of printed circuit boards, interlaminar insulating materials for build-up circuit boards, a plating resist, a photosensitive dry film, and fluorescent materials in the production of PDP.

2. Description of the Prior Art

In the soldering process which is carried out in mounting electronic parts on a printed circuit board, a solder resist is used for the purpose of preventing molten solder from adhering to irrelevant portions and protecting circuits. In recent years, a developing type solder resist composition which is used to form a pattern by a photolithographic method is widely adopted. Particularly, with due respect to the problem of environmental safety and from the viewpoint of cost, the solder resist composition of the alkali developing type has come to play the leading role. As a base resin used for these developing type solder resists, an actinic energy ray-curable resin obtained by the re-action of an epoxy resin with (meth)acrylic acid and the subsequent reaction of an acid anhydride with the resultant hydroxyl group of the modified resin is generally used.

Meanwhile, in consequence of the trend of IC and LSI parts toward highly dense mounting, the necessity of decreasing the width of circuit lines and the intervals between circuits of the printed circuit boards has been finding growing recognition. Besides, since the operating frequency of these parts to be mounted is enhanced, the heat value released from these parts increases accordingly. Therefore, the printed circuit board tends to require high thermal stability more than desired heretofore. In the actinic energy ray-curable resin obtained by using an epoxy resin as a starting raw material, however, since most of the functional groups which bond to an acid anhydride are secondary hydroxyl groups, the resin has the problem of relatively easily suffering the breakage of bonds when exposed to an increased temperature for a long time and, as result, inducing the possibility of degradation of such properties as insulation properties and resistance to heat and contamination of circuits due to the scattering of the decomposed acid anhydride.

In recent years, from the viewpoints of creation of a new organic reaction and its application to the synthesis of macromolecular compounds, the organic reaction involving the ring opening addition reaction of an oxetane ring which is an ether of four-membered ring has been studied. For example, the addition reaction of an oxetane compound and an active ester (T. Nishikubo and K. Sato, Chem. Lett., 697 (1992)) and the synthesis of polyester having a primary hydroxyl group attached to a side chain thereof by the polyaddition reaction of a bisoxetane and a dicarboxylic acid (T. Nishikubo, A. Kameyama, and A. Suzuki, Reactive.& Functional Polymers, 37, 19 (1998)) have been studied and reported. Further, the polyaddition reaction of a bisoxetane and a bisphenol has been reported recently (T. Nishikubo, A. Kameyama, M. Ito, T. Nakajima, and H. Miyazaki, Journal of Polymer Chemistry, Vol. 37, pp.2781–2790 (1998)) and tetraphenyl phosphonium bromide (TPPB) etc. are used as a reaction catalyst. However, these is no article which makes mention of the actinic energy ray-curable compositions of the present invention.

In general, a solder resist composition usually contains a polyfunctional epoxy compound having two or more epoxy groups as a thermosetting component for the purpose of improving the resistance to soldering heat.

Since the polyfunctional epoxy compound exhibits high reactivity, the photocurable and thermosetting resin composition containing this compound exhibits unduly short shelf life (useful life) and is liable to gain in viscosity prior to being applied to a blank circuit board. As a result, it is possible to formulate it as the one-package type only with difficulty. Accordingly, the composition requires to be formulated as the two-package type consisting of a hardener solution containing a polyfunctional epoxy compound as a main component thereof and a main agent solution containing a photosensitive prepolymer as a main component thereof and a curing promotor etc. added thereto. This poses the problem in working properties because it is necessary to mix them immediately prior to use.

Further, when the photocurable and thermosetting resin composition containing the polyfunctional epoxy compound is formed into a dry film, the shelf life (useful life) of this film becomes short and the preservation in the refrigerated state at a temperature of not more than 0° C. is required. That is to say, it is deficient in shelf stability at room temperature. Further, this dry film poses the problem in working properties because increase of its temperature to room temperature is required prior to use thereof.

SUMMARY OF THE INVENTION

An object of the present invention, therefore, is to solve the problems mentioned above and to provide a novel actinic energy ray-curable resin which is soluble in an aqueous alkaline solution and excellent in resistance to heat, thermal stability, etc and a method for the production thereof.

Another object of the present invention is to provide an alkali developing type photo curable and thermosetting resin composition which hardens promptly by irradiation of an actinic energy ray such as an ultraviolet ray or an electron beam or further hardens by heating, thereby capable of producing a cured film excelling in various properties such as resistance to heat, thermal stability, fastness of adhesion, and electrical insulating properties.

A further objects of the present invention are to provide an alkali developing type photocurable and thermosetting resin composition, which excels in storage stability, thus is capable of being formulated as a one-package preparation, and is capable of producing a cured film excelling in various properties such as resistance to heat, thermal-stability, fastness of adhesion, and electrical insulating properties and a photosensitive film capable of being stored at room temperature.

To accomplish the objects mentioned above, in accordance with the first aspect of the present invention, there is provided an actinic energy ray-curable resin (A) which is obtained by causing the reaction of (a) an oxetane compound containing at least two oxetane rings (hereinafter referred to as "polyfunctional oxetane compound") with (b) an unsaturated monocarboxylic acid and the subsequent reaction of (c) a polybasic acid anhydride with a primary hydroxyl group of the resultant modified oxetane resin (a') and has at least one structure represented by the following general formula (1):

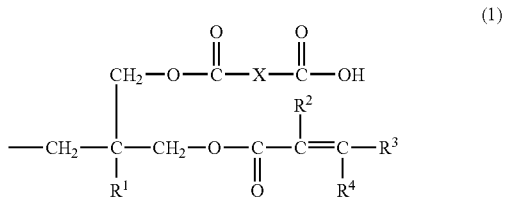

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

In accordance with the second aspect of the present invention, there is provided a process of producing the aforementioned actinic energy ray-curable resin characterized by comprising causing the reaction of (a) an polyfunctional oxetane compound containing at least two oxetane rings with (b) an unsaturated monocarboxylic acid and the subsequent reaction of (c) a polybasic acid anhydride with a primary hydroxyl group of the resultant modified oxetane resin (a').

In a preferred embodiment, 0.1 to 1.0 mol of the unsaturated monocarboxylic acid (b) is caused to react with one chemical equivalent of the oxetane ring in the polyfunctional oxetane compound (a) and 0.1 to 1.0 mol of the polybasic acid anhydride (c) is caused to react with one chemical equivalent of the primary hydroxyl group in the resultant modified oxetane resin (a'). As the unsaturated monocarboxylic acid (b) mentioned above, acrylic acid and/or methacrylic acid prove to be preferable.

The actinic energy ray-curable resin (A) of the present invention is excellent in thermal stability and resistance to heat, is capable of causing photo-radical polymerization and further thermally curable by heat radicals owing to the presence of a photopolymerizable unsaturated double bond, and further is soluble in an aqueous alkaline solution owing to the presence of the carboxyl group. The actinic energy ray-curable resin as mentioned above can be easily produced according to the process of the present invention mentioned above.

According to the third aspect of the present invention, there is provided a curable composition containing the actinic energy ray-curable resin (A) mentioned above as a curing component. A fundamental embodiment thereof comprises (A) an actinic energy ray-curable resin having at least one structure represented by the general formula (1) mentioned above and (B) a polymerization initiator as essential components. As the polymerization initiator, a photopolymerization initiator (photo-radical polymerization initiator) and/or a heat radical polymerization initiator may be used.

In a preferred embodiment of the present invention, there is provided a photocurable and thermosetting resin composition characterized by comprising (A) an actinic energy ray-curable resin having at least one structure represented by the general formula (1) mentioned above, (B) a polymerization initiator, (C) a diluent, and (D) a polyfunctional oxetane compound.

Since the curable composition of the present invention uses as a photosensitive resin component the actinic energy ray-curable resin mentioned above which excels in thermal stability and resistance to heat and is soluble in an aqueous alkaline solution, it cures promptly by short-time irradiation of an actinic energy ray and further is thermally curable by heat radicals. Furthermore, it is possible to develop the compound with an aqueous alkaline solution after exposure to light.

Further, since the photocurable and thermosetting resin composition of the present invention contains a polyfunctional oxetane compound as a thermosetting component besides the actinic energy ray-curable resin mentioned above as a photosensitive resin component, it is capable of being formulated as a one package preparation, exhibits longer shelf life (useful life), and is allowed to form a photosensitive dry film which can be stored at room temperature. By the use of the photocurable and thermosetting resin composition of the present invention, it is possible to obtain a cured product excelling in resistance to cracking, electrical insulation properties, resistance to heat, fastness of adhesion, resistance to chemicals, etc. without causing any shrinkage on thermal curing carried out after the exposure to light and development.

In accordance with the fourth aspect of the present invention, there is provided a product manufactured by using the photocurable and thermosetting resin composition mentioned above such as, for example, a printed circuit board having a solder resist, a multi-layer printed circuit board having an insulating layer formed between conductor circuit layers, and a photosensitive dry film having a photosensitive layer, respectively formed by using the photocurable and thermosetting resin composition mentioned above.

BRIEF DESCRIPTION OF THE DRAWING

The single FIGURE shows the IR spectrum of the resin produced in Synthesis Example 1 to be described hereinafter.

DETAILED DESCRIPTION OF THE INVENTION

The present inventors, after continuing a diligent study to solve the problems mentioned above, have found that by using a compound containing oxetane rings as a starting raw material instead of an epoxy compound which preponderantly causes a secondary hydroxyl group by the reaction with an unsaturated monocarboxylic acid, specifically by causing a polyfunctional oxetane compound (a) to react with an unsaturated monocarboxylic acid (b) and then further causing a polybasic acid anhydride (c) to react with a primary hydroxyl group of the resultant modified oxetane resin (a'), there is obtained an actinic energy ray-curable resin of which bonding sites suffer the thermal breakage only with difficulty and which excels in resistance to heat and thermal stability and that the use of this resin allows the preparation of an alkali developing type photocurable and thermosetting resin composition excelling in resistance to heat and thermal stability.

Specifically, the actinic energy ray-curable resin of the present invention is capable of promptly curing by short-time irradiation of an actinic energy ray owing to the structure having a photopolymerizable unsaturated double bond, particularly (meth)acryloyl group, and also thermally curable by heat radicals owing to the presence of the unsaturated double bond. Further, since the functional group to which a polybasic acid anhydride (c) is bonded is a primary hydroxyl group of the modified oxetane resin (a') caused by the reaction of the polyfunctional oxetane compound (a) with the unsaturated monocarboxylic acid (b), the resultant resin excels in thermal stability and resistance to heat. Furthermore, the actinic energy ray-curable resin of the present invention has a carboxyl group introduced thereinto by causing the polybasic acid anhydride (c) to react with the primary hydroxyl group of the modified oxetane resin (a'), it is soluble in an aqueous alkaline solution. Accordingly, the curable composition containing this resin as a curing component, particularly the photocurable and thermosetting resin composition cures promptly by short-time irradiation of an actinic energy ray, can be developed with an aqueous alkaline solution after exposure to light, and allows formation of a cured film excelling in various properties such as resistance to heat, fastness of adhesion, electrical insulating properties, and resistance to chemicals by the thermal curing of the coating film thereof after exposure to light and development, without causing any shrinkage on curing.

Now, the actinic energy ray-curable resin of the present invention will be described below.

The actinic energy ray-curable resin of the present invention is obtained by causing (a) a polyfunctional oxetane compound to react with (b) an unsaturated monocarboxylic acid and subsequently causing (c) a polybasic acid anhydride to react with a primary hydroxyl group of the resultant modified oxetane resin (a'). The reaction processes are illustrated as follows.

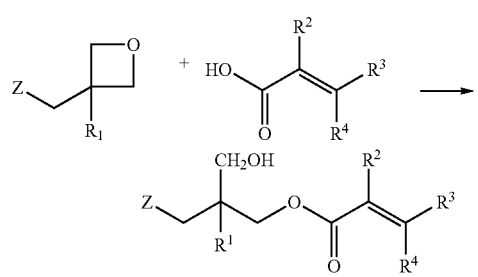

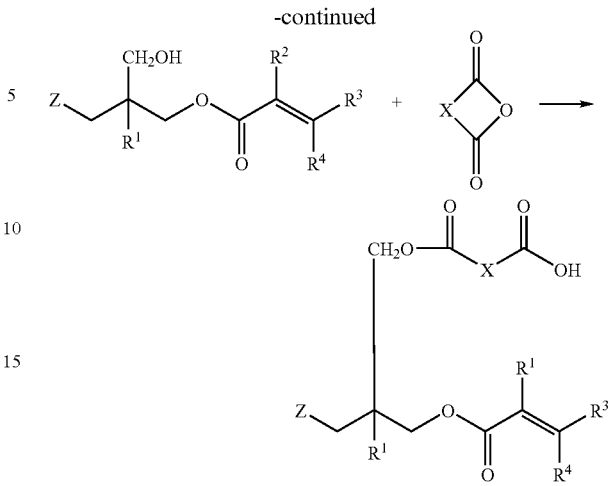

The modified oxetane resin (a') of the reaction intermediate can be produced by causing the reaction of the polyfunctional oxetane compound (a) with the unsaturated monocarboxylic acid (c) in the presence of a suitable reaction promotor. The polyfunctional oxetane compound (a) to be used for the above-mentioned reaction is not limited to a particular one insofar as it has at least two oxetane rings in its molecule.

As typical examples of the compound containing two oxetane rings in its molecule, bisoxetanes represented by the following general formula (2) may be cited.

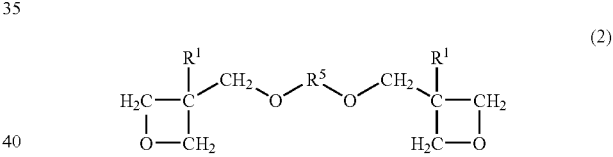

In the general formula (2) mentioned above, $R^1$ represents the same meaning as mentioned above, and $R^5$ represents a bivalent group selected from among linear or branched saturated hydrocarbons of 1 to 12 carbon atoms, linear or branched unsaturated hydrocarbons of 1 to 12 carbon atoms, aromatic hydrocarbons represented by the following formulas (A), (B), (C), (D), and (E), linear or cyclic alkylene groups containing a carbonyl group and represented by the following formulas (F) and (G) and aromatic hydrocarbons containing a carbonyl group and represented by the following formulas (H) and (I).

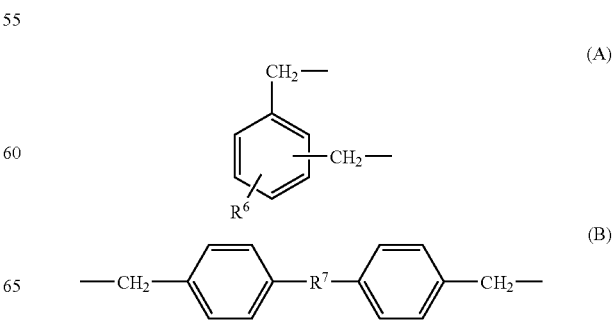

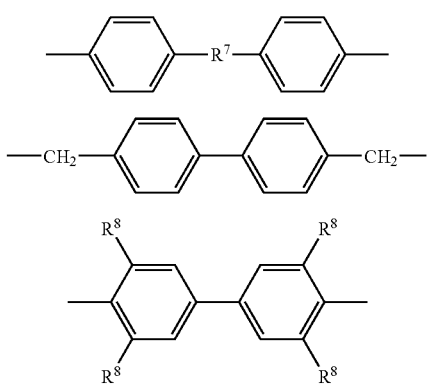

wherein R[6] represents a hydrogen atom, an alkyl group of 1 to 12 carbon atoms, an aryl group, or an aralkyl group, R[7] represents —O—, —S—, —CH$_2$—, —NH—, —SO$_2$—, —CH(CH$_3$)—, —C(CH$_3$)$_2$—, or —C(CF$_3$)$_2$—, and R[8] represents a hydrogen atom or an alkyl group of 1 to 6 carbon atoms.

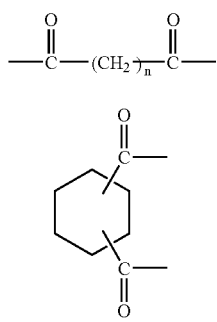

wherein n represents an integer of 1 to 12.

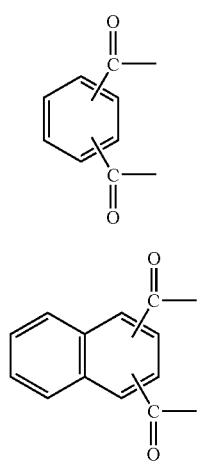

As typical examples of the compound containing three or more oxetane rings in its molecule, etherified products of an oxetane with a hydroxyl group-containing resin such as a novolak resin, poly(p-hydroxy styrene), cardo type oxetane resin, calixarenes, or a silicone resin like a cylseski oxane besides a compound represented by the following general formula (3) may be cited. In addition thereto, a copolymer of an unsaturated monomer containing an oxetane ring and an alkyl (meth)acrylate may be cited. The term "(meth)acrylate" as used in the present specification refers collectively to acrylate and methacrylate. This holds good for other similar expression.

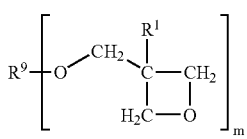

In the general formula (3) mentioned above, R[1] represents the same meaning as mentioned above, R[9] represents a residue of the hydroxyl group-containing resin of the etherified product mentioned above, a branched alkylene group of 1 to 12 carbon atoms represented by the following formula (J) (K) or (L), or an aromatic hydrocarbon represented by the following formula (M), (N) or (P), and m represents the number of functional groups bonded to the residue R[9], an integer of three or more, preferably an integer of 3 to 5,000.

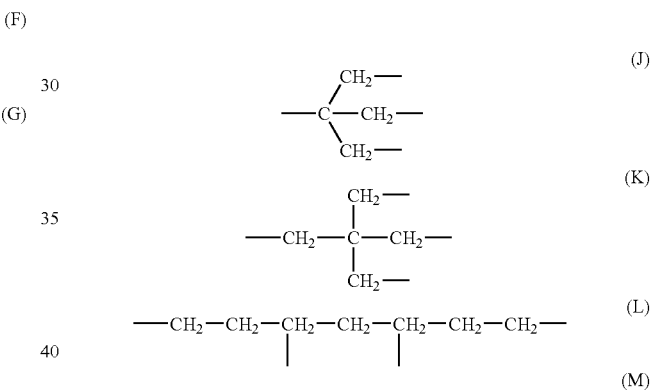

wherein R[10] represents a hydrogen atom, an alkyl group of 1 to 6 carbon atoms, or an aryl group.

As the unsaturated monocarboxylic acid (b) to be used for the reaction mentioned above, a compound containing a polymerizable unsaturated group and a carboxylic group in combination in its molecule is preferable. As concrete examples, acrylic acid, methacrylic acid, cinnamic acid, crotonic acid, sorbic acid, α-cyanocinnamic acid, β-styryl acrylic acid, etc. may, be cited. Alternatively, a half ester of a dibasic acid anhydride with a (meth)acrylate having a hydroxyl group may be used. As concrete examples, the half esters of the acid anhydride such as phthalic acid, tetrahydrophthalic acid, hexahydrophthalic acid, maleic acid, and succinic acid with the hydroxyl group-containing (meth) acrylate such as hydroxyethyl acrylate, hydroxyethyl methacrylate, hydroxypropyl acrylate, and hydroxypropyl methacrylate may be cited. These unsaturated monocarboxylic acids may be used either singly or in the form of a combination of two or more members.

In the reaction mentioned above, the ratio of the polyfunctional oxetane compound (a) to the unsaturated monocarboxylic acid (b) (the charging ratio in the reaction mixture) is desired to be such that the ratio of equivalent weights of oxcetane ring/carboxylic acid is not less than 0.1, preferably in the range of 0.3 to 1.0. If the ratio of equivalent weights mentioned above is lower than 0.1, the compound will be at a disadvantage in acquiring insufficient polymerizable groups introduced into the reaction product and thus an unduly low photo-curing properties and, as a result, failing to allow a coating film to have sufficient properties. Conversely, the ratio of equivalent weights mentioned above exceeding 1.0 is not preferable because the unreacted unsaturated monocarboxylic acid remains in the resin. When the unsaturated monocarboxylic acid remains in the unreacted state, it may be removed by a well known method such as vacuum distillation and alkali cleaning.

When the modified oxetane resin (a') of a higher molecular weight is needed, part of the unsaturated monocarboxylic acid (b) to be used for the reaction may be replaced with a polycarboxylic acid or polyphenol of bifunctionality or more functionality. Particularly, it is possible to obtain a linear macromolecular compound in the case of the bifunctional carboxylic acid or phenol and a branched macromolecular compound in the case of the trifunctional carboxylic acid or phenol. As concrete examples of the polycarboxylic acid, bifunctional carboxylic acids such as succinic acid, adipic acid, muconic acid, suberic acid, tetrahydrophthalic acid, hexahydrophthalic acid, hexahydroisophthalic acid, phtalic acid, isophtalic acid, and terephtalic acid, and trifunctional carboxylic acids such as 1,2,3-propane tricarboxylic acid, citric acid, aconitic acid, and trimellitic acid maybe cited. As concrete examples of the polyphenol, bifunctional phenols such as catechol, resorcin, hydroquinone, 1,4-naphthalene diol, 1,5-naphthalene diol, bisphenol A, and biphenol, and trifunctional phenols such as 2,4,4'-trihydroxybenzophenone and 4,4',4''-methylidene trisphenol may be cited.

As a reaction promotor, any compound may be arbitrarily selected from among a tertiary amine, a tertiary amine salt, a quaternary onium salt, a tertiary phosphine, a phosphonium ylide, and a crown ether complex. These compounds may be used either singly or in the form of a combination of two or more members.

As the tertiary amine, triethylamine, tributylamine, DBU (1,8-diazabicyclo[5.4.0]undeca-7-ene), DBN (1,5-diazabicyclo[4.3.0]nona-5-ene), DABCO (1,4-diazabicyclo[2.2.2] octane), pyridine, N,N-dimethyl-4-amino pyridine, etc. may be cited.

As the tertiary amine salt, U-CAT series of Sun-Apro K.K., for example, may be cited.

As the quaternary onium salt, ammonium salts, phosphonium salts, arsonium salts, stibonium salts, oxonium salts, sulfonium salts, selenonium salts, stannonium salts, iodonium salts, etc. may be cited. Particularly preferable salts are ammonium salts and phosphonium salts. As concrete examples of the ammonium salts, tetra-n-butylammonium halide such as tetra-n-butylammonium chloride (TBAC), tetra-n-butylammonium bromide (TBAB), and tetra-n-butylammonium iodide (TBAI), and tetra-n-butylammonium acetate (TBAAc) may be cited. As concrete examples of the phosphonium salts, tetra-n-butylphosphonium halide such as tetra-n-butylphosphonium chloride (TBPC), tetra-n-butylphosphonium bromide (TBPB), and tetra-n-butylphosphonium iodide (TBBI), tetraphenylphosphonium halide such as tetraphenylphosphonium chloride (TPPC), tetraphenylphosphonium bromide (TPPB), and tetraphenylphosphonium iodide (TPPI), and ethyltriphenylphosphonium bromide (ETPPB), ethyltriphenylphosphonium acetate (ETPPAc), etc. may be cited.

As the tertiary phosphine, any trivalent organic phosphorus compounds containing an alkyl group of 1 to 12 carbon atoms or an aryl group may be used. As the concrete examples thereof, triethylphosphine, tributylphosphine, triphenylphosphine, etc. may be cited.

Further, a quaternary onium salt obtained by the addition reaction of a tertiary amine or a tertiary phosphine with a carboxylic acid or a highly acidic phenol may be used as the reaction promotor. They may be in the form of a quaternary salt before adding to the reaction system. Alternatively, they may be individually added to the reaction system so as to form the quaternary salt in the reaction system. As the concrete examples thereof, tributylamine acetic acid salt obtained from tributylamine and acetic acid and triphenylphosphine acetic acid salt formed from triphenylphosphine and acetic acid may be cited.

Although any known compounds obtained by the reaction of a phosphonium salt and a base may be used as the phosphonium ylide, a highly stable compound is preferable from the viewpoint of easy handling. As concrete examples thereof, (formylmethylene)triphenylphosphine, (acetylmethylene)triphenylphosphine, (pivaloylmethylene)triphenylphosphine, (benzoylmethylene)triphenylphosphine, (p-methoxybenzoylmethylene)triphenylphosphine, (p-methylbenzoylmethylene)triphenylphosphine, (p-nitrobenzoylmethylene)triphenylphosphine, (naphthoyl)triphenylphosphine, (methoxycarbonyl)triphenylphosphine, (diacetylmethylene)triphenylphosphine, (acetylcyano)triphenylphosphine, (dicyanomethylene)triphenylphosphine, etc. may be cited.

As concrete examples of the crown ether complex, complexes of crown ethers such as 12-crown-4, 15-crown-5, 18-crown-6, dibenzo-18-crown-6, 21-crown-7, and 24-crown-8 with alkali metal salts such as lithium chloride, lithiumbromide, lithium iodide, sodium chloride, sodium bromide, sodium iodide, potassium chloride, potassium bromide, and potassium iodide may be cited.

The amount of the reaction promotor to be used is preferred to be in the range of 0.1 to 25 mol %, more preferably 0.5 to 20 mol %, most preferably 1 to 15 mol %, based on one mol of the oxetanyl group. If the amount of the reaction promotor to be used is less than 0.1 mol % of the oxetanyl group, the reaction will not proceed at a practical reaction speed. Conversely, a large amount exceeding 25 mol % is not desirable from the economical viewpoint because a remarkable reaction promotion effect will not be obtained even when the promotor is present in such a large amount.

The reaction temperature is preferred to be in the approximate range of 100 to 200° C., more preferably 120 to 160° C. If the reaction temperature is lower than 100° C., the reaction will not proceed to a satisfactory extent. Conversely, the reaction temperature exceeding 200° C. is not desirable from the reasons that the reaction products will tend to cause the thermal polymerization due to the reaction of the double bonds thereof and that the unsaturated monocarboxylic acid having a low boiling point will evaporate. Although the reaction time may be suitably selected depending on the reactivity of the raw materials to be used and the reaction temperature, the preferred reaction time is about 5 to 72 hours.

Next, the reaction of the above resin with a polybasic acid anhydride will be described below. In accordance with the present invention, the actinic energy ray-curable resin is produced by causing 0.1 to 1.0 mol of the polybasic acid anhydride (c) to react with one chemical equivalent of the primary hydroxyl group of the modified oxetane resin (a') produced as described above. Since the primary hydroxyl group caused by the addition reaction of the oxetane ring with the unsaturated monocarboxylic acid is present in the modified oxetane resin (a') and the carboxyl group is introduced into the resin by the addition reaction of this hydroxyl group with the polybasic acid anhydride, the resultant resin will be soluble in an aqueous alkaline solution.

As concrete examples of the polybasic acid anhydrides (c), dibasic acid anhydrides such as phthalic anhydride, succinic anhydride, octenylphthalic anhydride, pentadodecenylsuccinic anhydride, maleic anhydride, tetrahydrophthalic anhydride, hexahydrophthalic anhydride, methyltetrahydrophthalic anhydride, 3,6-endomethylenetetrahydrophthalic anhydride, methylendomethylenetetrahydrophthalic anhydride, tetrabromophthalic anhydride, chlorendic anhydride, and trimellitic anhydride; and tetrabasic acid dianhydrides such as biphenyl-tertacarboxylic dianhydride, naphthalene-tertacarboxylic dianhydride, diphenyl ether-tertacarboxylic dianhydride, cyclopentane-tertacarboxylic dianhydride, pyromellitic anhydride, and benzophenone-tetracarboxylic dianhydride may be used. These polybasic acid anhydrides may be used either singly or in the form of a combination of two or more members.

The reaction of the polybasic acid anhydride (c) with the modified oxetane resin (a') may be performed at a temperature in the approximate range of 50 to 150° C., preferably 80 to 130° C. in a proportion as mentioned above. The amount of the polybasic acid anhydride (c) to be used is preferred to be in the range of 0.1 to 1.0 mol per one chemical equivalent of the primary hydroxyl group of the modified oxetane resin (a'). The amount of the polybasic acid anhydride lower than 0.1 mol is not preferable from the reason that the amount of the carboxyl groups introduced into the resin is too small and thus sufficient alkali-solubility is not imparted to the resin. Conversely, an unduly large amount exceeding 1.0 is not preferable because the unreacted unsaturated monocarboxylic acid remains in the resin and it will deteriorate the properties of the resin such as durability and electrical insulation properties.

In the reaction of the polybasic acid anhydride (c) with the modified oxetane resin (a') mentioned above, a reaction promotor such as a tertiary amine, a tertiary amine salt, a quaternary onium-salt, a tertiary phosphine, a phosphonium ylide, a crown ether complex, and an adduct of a tertiary amine or a tertiary phosphine with a carboxylic acid or a highly acidic phenol maybe used. The amount of the reaction promotor to be used is preferred to be in the range of 0.1 to 25 mol %, preferably 0.5 to 20 mol %, most preferably 1 to 15 mol %, of the polybasic acid anhydride (c). If the catalyst used for the reaction of the unsaturated monocarboxylic acid mentioned above still remains in the system, however, the reaction will be promoted even if the catalyst is not newly added.

Although the aforementioned reaction of the polyfunctional oxetane compound (a) with the unsaturated monocarboxylic acid (b) and the reaction of the modified oxetane resin (a') with the polybasic acid anhydride (c) proceed either in the presence of an organic solvent or in the absence of a solvent, the reaction may also be performed in the presence of a diluent to be described hereinafter for the purpose of improving the agitating effect during the reaction. When the organic solvent is used as the diluent during the synthesis, the solvent maybe removed by a well-known method such as vacuum distillation.

As the organic solvent, any known organic solvents may be used insofar as they will not exert a harmful influence on the reaction and can keep the reaction temperature. As concrete examples thereof, alcohols such as diethylene glycol monomethyl ether, diethylene glycol monoethyl ether, dipropylene glycol monomethyl ether, and dipropylene glycol monobutyl ether; glycol esters such as ethylene glycol monomethyl ether acetate, diethylene glycol monomethyl ether acetate, diethylene glycol monoethyl ether acetate, propylene glycol monomethyl ether acetate, and dipropylene glycol monomethyl ether acetate; ethers such as diethylene glycol dimethyl ether and dipropylene glycol dimethyl ether; ketones such as methylisobutyl ketone and cyclohexanone; and aromatic hydrocarbons such as toluene and xylene may be cited.

In the aforementioned reaction of the polyfunctional oxetane compound (a) with the unsaturated monocarboxylic acid (b) and the reaction of the modified oxetane resin (a') with the polybasic acid anhydride (c), air blowing or the addition of a polymerization inhibitor may be done for the purpose of preventing the reaction mixture from gelation due to polymerization of the unsaturated double bonds. As the examples of the polymerization inhibitor, hydroquinone, toluquinone, methoxyphenol, phenothiazine, triphenyl antimony, copper chloride, etc. may be cited.

By mixing the actinic energy ray-curable resin (A) obtained by the method of the present invention with a photo-radical polymerization initiator and/or a heat radical polymerization initiator which generate radicals by irradiation of an actinic energy ray or by heating as the polymerization initiator (B), an actinic energy ray-curable composition or a photocurable and thermosetting composition may be obtained. Further, by adding a reactive monomer as the diluent (C) to be described herein after to the composition, it is possible to improve the photo-curing properties thereof. Incidentally, the amount of the actinic energy ray-curable resin (A) to be incorporated in the curable composition of the present invention, particularly the actinic energy ray-curable composition is not limited to a particular range.

As the photo-radical polymerization initiator to be used as the polymerization initiator (B), any known compounds which generate radicals by irradiation of an actinic energy ray may be used. As concrete examples thereof, benzoin and alkyl ethers thereof such as benzoin, benzoin methyl ether, and benzoin ethyl ether; acetophenones such as acetophenone, 2,2-dimethoxy-2-phenyl acetophenone and 4-(1-t-butyldioxy-1-methylethyl) acetophenone; anthraquinones such as 2-methylanthraquinone, 2-amylanthraquinone, 2-t-butyl anthraquinone, and 1-chloroanthraquinone; thioxanthones such as 2,4-dimethylthioxanthone, 2,4-diisopropylthioxanthone, and 2-chlorothioxanthone; ketals such as acetophenone dimethyl ketal and benzyl dimethyl ketal; benzophenones such as benzophenone, 4-(1-t-butyldioxy-1- methylethyl) benzophenone, and 3,3',4,4'-tetrakis(t-butyldioxycarbonyl) benzophenone; aminoacetophenones such as 2-methylthio-1-[4-(methylthio)phenyl]-2-morpholino-propane-1-one and 2-benzyl-2-dimethylamino-1-(4-morpholinophenyl)-butane-1-one; alkylphosphines such as 2,4,6-trimethylbenzoyl phosphine oxide; and acryzines such as 9-phenyl acryzine may be cited.

These well-known and widely used photo-radical polymerization initiators may be used either singly or in the form of a combination of two or more members. The amount of the photo-radical polymerization initiator to be used is preferred to be in the range of from 0.1 to 30 parts by weight, based on 100 parts by weight of the actinic energy ray-curable resin (A) mentioned above. If the amount of the photo-radical polymerization initiator to be used is less than the lower limit of the range mentioned above, the composition will not be photocured by irradiation of an actinic energy ray or the irradiation time should be prolonged, and a coating film of satisfactory properties will be obtained only with difficulty. Conversely, even if the photo-radical polymerization initiator is added to the composition in a large amount exceeding the upper limit of the range mentioned above, the composition will not attain the further improvement in the curing properties and such a large amount is not desirable from the economical viewpoint.

In the curable composition, particularly the photocurable and thermosetting composition of the present invention, for the purpose of improving the curing with an actinic energy ray, a curing promotor and/or sensitizer may be used in combination with the photo-radical polymerization initiator mentioned above. As the curing promoters which are usable herein, tertiary amines such as triethylamine, triethanolamine, 2-dimethylaminoethanol, N,N-(dimethylamino)ethyl benzoate, N,N-(dimethylamino)isoamyl benzoate, and pentyl-4-dimethylamino benzoate; and thioethers such as β-thiodiglycol may be cited. As the sensitizer, sensitizing dyestuff such as (keto) cumalin and thioxantene; and alkyl borates of such dyestuff as cyanine, rhodamine, safranine, malachite green, and methylene blue maybe cited. These curing promotors and/or sensitizers may be used independently either singly or in the form of a combination of two or more members. The amount of the curing promoters and/or sensitizers to be used is preferred to be in the range of from 0.1 to 30 parts by weight, based on 100 parts by weight of the actinic energy ray-curable resin (A) mentioned above.

As the heat radical polymerization initiators which are usable in the present invention, organic peroxides such as benzoyl peroxide, acetyl peroxide, methyl ethyl ketone peroxide, lauroyl peroxide, dicumyl peroxide, di-t-butyl peroxide, t-butyl hydroperoxide, and cumene hydroperoxide; and azo type initiators such as 2,2'-azobisisobutyronitrile, 2,2'-azobis-2-methylbutyronitrile, 2,2'-azobis-2,4-divaleronitrile, 1,1'-azobis(1-acetoxy-1-phenylethane), 1'-azobis-1-cyclohexane carbonitrile, dimethyl-2,2'-azobisisobutylate, 4,4'-azobis-4-cyanovalic acid, and 2-methyl-2,2'-azobispropanenitrile may be cited. As the preferred initiator, 1,1'-azobis(1-acetoxy-1-phenylethane) of the non-cyane and non-halogen type is cited. The heat radical polymerization initiator is used in the range of 0.1 to 10 parts by weight, preferably.0.5 to 5 parts by weight, based on 100 parts by weight of the actinic energy ray-curable resin (A) mentioned above.

When an organic peroxide which exhibits a lower curing rate is used as the heat radical polymerization initiator, tertiary amines such as tributylamine, triethylamine, dimethyl-p-toluidine, dimethylaniline, triethanolamine, and diethanolamine, or metallic soap such as cobalt naphthenate, cobalt octoate, and manganous naphthenate may be used as a promotor.

Further, when the addition reaction of the polyfunctional oxetane compound (a) with the unsaturated monocarboxylic acid (b) is performed in such a proportion that the ratio of equivalent weight of the unsaturated monocarboxylic acid to that of the oxetanyl group is less than 1.0 mol (that is to say, the case that the oxetane ring remains in the ester compound obtained), the actinic energy ray-curable resin of the present invention can be formulated as the radical-cationic hybrid curing system by adding a cationic polymerization initiator which initiates the photo-cationic polymerization by irradiation of an actinic energy ray. Accordingly, it is possible to obtain a cured product by employing the photo-cationic polymerization in combination the radical polymerization. As the cationic polymerization initiator, any of the well-known cationic polymerization initiators such as diaryl iodonium salts, triaryl sulfonium salts, thiobistriaryl sulfonium salts, selenonium salts, and phosphonium salts may be used. These cationic polymerization initiators may be used either singly or in the form of a combination of two or more members. The amount of the cationic polymerization initiator to be incorporated in the curable composition may be is in the conventionally used range, generally not less than 0.05 part by weight, preferably not less than 0.1 part by weight, most preferably in the range of 0.5 to 10 parts by weight, based on 100 parts by weight of the actinic energy ray-curable resin (A) mentioned above.

The curable composition, particularly the photocurable and thermosetting composition of the present invention may incorporate a diluent therein. As the diluent (C), a compound having a polymerizable group which is capable of taking part in the curing reaction can be used besides an organic solvent. Any known reactive diluents such as, for example, monofunctional acrylates and/or polyfunctional acrylates can be used. As concrete examples thereof, methyl (meth)acrylate, ethyl (meth)acrylate, n-butyl (meth)acrylate, isobutyl (metha)crylate, 2-ethylhexyl (meth)acrylate, isodecyl (meth)acrylate, lauryl (meth)acrylate, tridecyl (meth)acrylate, stearyl (meth)acrylate, methoxypolyethylene glycol (meth)acrylate, cyclohexyl (meth)acrylate, tetrahydrofurfuryl (meth)acrylate, isobornyl (meth)acrylate, benzyl (meth)acrylate, 2-hydroxyethyl (meth)acrylate, 2-hydroxypropyl (meth)acrylate, 2-hydroxybutyl (meth)acrylate, dimethylaminoethyl (meth)acrylate, ethylene glycol di(meth)acrylate, diethylene glycol di(meth)acrylate, 1,4-butanediol di(meth)acrylate, 1,6-hexanediol di(meth)acrylate, trimethylol propane tri(meth)acrylate, glycerin di(meth)acrylate, pentaerythritol tri(meth)acrylate, pentaerythritol tetra(meth)acrylate, dipentaerythritol hexa(meth)acrylate, polyester acrylate, reaction products of dibasic acid anhydrides with alcohols having one or more unsaturated groups in its molecule, etc. may be cited. The diluents (c) can be used either singly or in the form of a mixture of two or more members and the amount thereof is not limited to a particular range.

Then, the photocurable and thermosetting resin composition of the present invention will be described below.

The first characteristic feature of the photocurable and thermosetting resin composition of the present invention resides in the use of the alkali-soluble actinic energy ray-curable resin (A) excelling in thermal stability and resistance to heat as mentioned above and the second characteristic feature in the use of the polyfunctional oxetane compound (D) as a thermosetting component. By using the polyfunctional oxetane compound (D) as the thermosetting component in combination with the actinic energy ray-curable resin (A), the polymerization initiator (B), and the diluent (C) mentioned above, the resultant photocurable and thermosetting resin composition can be formulated as a one-package preparation and excels in shelf life (useful life). When this photocurable and thermosetting resin composition is applied to a substrate to form a film and the coating film of the composition is thermally cured after exposure to light and development, there is obtained a cured film excellent in various properties such as resistance to heat, fastness of adhesion, and electrical insulating properties, without causing any shrinkage on curing and cracks. Further, the use of the photocurable and thermosetting resin composition of the present invention allows formation of a photosensitive dry film which can be stored at room temperature.

Specifically, since the photocurable and thermosetting resin composition of the present invention contains the polyfunctional oxetane compound (D) having oxetanyl groups of a four membered ring which reacts with the carboxyl groups of the actinic energy ray-curable resin (A) during the step of thermal curing to cause primary hydroxyl groups predominantly, the resultant cured film is excellent in adhesiveness to a substrate as compared with that obtained by the composition using a polyfunctional epoxy compound which causes secondary hydroxyl groups preponderantly by the reaction with the above resin. Further, since the cured film contains a large number of ethylene units after the reaction because of the four membered ring, it scarcely suffers volume shrinkage and excels in toughness. As a result, there is obtained a cured film which exhibits excellent resistance to cracking. Furthermore, since the reactivity of the polyfunctional oxetane compound is lower than that of the polyfunctional epoxy compound, the photocurable and thermosetting resin composition containing the polyfunctional oxetane compound exhibits longer shelf life (useful life), can be formulated as a one package preparation, and allows formation of a photosensitive dry film which can be stored at room temperature. The use of such a photosensitive dry film is advantageous in terms of workability. Moreover, another effect of further improving the insulating reliability may also be attained depending on the method for the production of the polyfunctional oxetane compound.

As the polyfunctional oxetane compounds (D), etherified products of an oxetane with a hydroxyl group-containing resin such as a novolak resin, poly(hydroxystyrene), calix-arenes, or a silicone resin like a cylseski oxane besides bisoxetanes having two oxetane rings and represented by the general formula (2) mentioned above and the compound having three oxetane rings and represented by the general formula (3) mentioned above, which are to be used as the starting material of the actinic energy ray-curable resin (A), may be cited.

The polyfunctional oxetane compounds (D) as mentioned above may be used either singly or in the form of a combination of two or more members. Among other oxetane compounds cited above, the finely pulverized oxetane resins which exhibit sparing solubility in the diluent (C) mentioned above or a combination of the sparingly soluble oxetane resin and the soluble oxetane resin prove to be particularly desirable. The amount of the polyfunctional oxetane compound (D) mentioned above to be incorporated in the composition as a thermosetting component is desired to be in the range of 5 to 100 parts by weight, preferably 15 to 60 parts by weight, based on 100 parts by weight of the actinic energy ray-curable resin (A) mentioned above.

It is also preferable that a curing promotor (E) be incorporated into the composition together with the polyfunctional oxetane compound (D) mentioned above. As the curing promotor (E), any compound may be arbitrarily selected from among tertiary amines, tertiary amine salts, quaternary onium salts, tertiary phosphines, imidazole derivatives, and crown ether complex (such as, for example, 18-crown-6/potassium phenoxide, potassium benzoether, KCl, KBr or ammonium acetate). These compounds may be used either singly or in the form of a combination of two or more members. Besides, a phosphonium ylide etc. may be used.

In the photocurable and thermosetting resin composition of the present invention, an epoxy compound may be mixed as part of the thermosetting component in a proportion not so large as to adversely affect the effects of the use of the polyfunctional oxetane compound as the thermosetting component. As the epoxy compound mentioned above, any compound my be used insofar as it has at least two epoxy groups in its molecule. As the examples of the epoxy compound, various well-known and popularly adopted epoxy compounds such as, for example, glycidyl ether compounds such as bisphenol A epoxy resin, bisphenol F epoxy resin, bisphenol S epoxy resin, brominated bisphenol A epoxy resin, hydrogenated bisphenol A epoxy resin, biphenol epoxy resin, bixylenol epoxy resin, alicyclic epoxy resin, phenol novolak epoxy resin, cresol novolak epoxy resin, brominated phenol novolak epoxy resin, and novolak epoxy resin of bisphenol A; glycidyl ester compounds such as terephthalic diglycidyl ester, hexahydrophthalic diglycidyl ester, and dimeric diglycidyl ester; and glycidyl amine compounds such as triglycidyl isocyanurate, N,N,N',N'-tetraglycidyl methaxylene diamine, N,N,N',N'-tetraglycidyl bis(aminomethyl)-cyclohexane, and N,N-diglycidyl aniline may be used. These epoxy compounds may be used either singly or in the form of a combination of two or more members. Although any epoxy compounds which exhibit sparing solubility or solubility in a diluent (C) to be used maybe used as the epoxy compound, the finely pulverized epoxy compound which exhibits sparing solubility in a diluent and is in the state of solid or semi-solid at room temperature or a combination of this sparingly soluble epoxy compound and the soluble epoxy compound prove to be particularly desirable from the viewpoint of developability etc.

Further, for the purpose of promoting the thermal curing reaction, a small amount of a well-known epoxy curing promotor such as quaternary ammonium salts, quaternary phosphonium salts, tertiary amines, imidazoles, and dicyandiamide may be used in combination therewith.

The actinic energy ray-curable composition or the photocurable and thermosetting resin composition of the present invention as described above may incorporate therein, as desired, a well-known and widely used filler such as barium sulfate, silica, talc, clay, and calcium carbonate, a well-known and widely used coloring pigment such as phthalocyanine blue, phthalocyanine green, titanium oxide, and carbon black, and various additives such as an anti-foaming agent, an adhesiveness-imparting agent, and a leveling agent.

The actinic energy ray-curable composition or the photocurable and thermosetting resin composition of the present invention obtained as described above is adjusted, when necessary, to a level of viscosity suitable for the coating method by addition of the diluent etc., applied by a suitable coating method such as a screen printing method, a curtain coating method, a roll coating method, a dip coating method, and a spin coating method to a substrate of a printed circuit board, and then predried at a temperature in the approximate range of 60 to 120° C., for example, thereby to evaporate the organic solvent from the composition and give rise to a coating film. Thereafter, the composition coated on the substrate is selectively exposed to an actinic energy ray through a photomask having a prescribed exposure pattern and the composition in the unexposed areas of the coating film is developed with an aqueous alkaline solution to obtain a resist pattern.

When the composition is also used as a material for the interlaminar insulating layer in a build-up multi-layer printed circuit board, a pattern may be formed in the same manner as mentioned above.

In the case of the photocurable and thermosetting resin composition containing a thermosetting component, the resist film formed in the manner mentioned above is further thermally cured by subjecting to the heat treatment at a temperature in the approximate range of 100 to 200° C. for about 30 to 60 minutes for the purpose of improving the properties. By this thermal treatment, in addition to the curing reaction of the aforementiond thermosetting components, the polymerization of the photocurable resin components is promoted and the copolymerization of this component with the thermosetting component are also facilitated so that the consequently produced resist film acquires improvements in various properties such as resistance to heat, resistance to adhesion of solder, resistance to solvents, resistance to acids, adhesiveness, resistance to electroless gold plating, electric properties, printability, and hardness.

In the manufacture of a photosensitive dry film, the photocurable and thermosetting resin composition of the present invention as mentioned above is adjusted, when necessary, to a level of viscosity suitable for the coating method, applied to a suitable supporting film such as, for example, a flexible base film, and then dried at a temperature in the approximate range of 60 to 100° C., for example, thereby to evaporate the organic solvent from the composition and give rise to a tack-free photocurable and thermosetting dry film (photosensitive film). It is preferred to preserve the photosensitive film formed on the base film until use thereof in such a state that the photosensitive film is protected by a cover film laminated thereon.

As the base film, various synthetic resin films made of, for example, polyethylene terephthalate (PET) polyethylene (PE), polypropylene, polycarbonate, polyether sulfone, or polyvinyl chloride may be used. The proper thickness of the base film is in the range of 15 to 125 μm.

For the formation of a coating film, various coating methods using an applicator, a bar coater, a roll coater, a die coater, a curtain flow coater, a spin coater, etc. or the screen printing method and the like maybe adopted. The proper thickness of the coating film is in the range of 10 to 150 μm as the thickness after drying.

The cover film to be laminated on the photosensitive film is used for stably protecting the photosensitive film at the time of not putting to use and removed at the time of use. Therefore, it should have such proper release characteristics that it is not peeled off at the time of not putting to use, but it can be easily separated from the photosensitive film at the time of use. As the cover film which fulfills such requirements, a PET film, a polypropylene film, a PE film, etc. may be used. Further, the above-mentioned film further coated with silicone or baked may be used. This cover film is preferred to have a thickness in the range of about 15 to 100 μm.

Moreover, for the purpose of preventing the photocurable and thermosetting resin composition from suffering the sensitivity reduction owing to oxygen and adhesion of the photomask for pattern formation to be tightly laminated thereon at the time of exposure, it is possible to further form a layer of a water-soluble resin composition on the photosensitive film. In the case of such a photosensitive film, it is preserved by laminating the cover film on the layer of the water-soluble resin composition. The layer of the water-soluble resin composition is formed by applying an aqueous 5–20 wt. % solution of polyvinyl alcohol or partially saponified polyvinyl acetate to the photosensitive film in such a proportion that the thickness may become 1–10 μm as the dry film thickness and drying it.

Incidentally, ethylene glycol, propylene glycol, polyethylene glycol, etc. may also be added to the solution of the water-soluble resin composition. In the preparation of this solution, when taking the viscosity and anti-foaming properties thereof into consideration, a solvent such as, for example, methanol, ethylene glycol monomethyl ether acetate, and acetone or a commercially available water-soluble anti-foaming agent or the like may also be added thereto.

In the formation of a coating film on a substrate to be processed, first the base film is separated from the photosensitive film and the photosensitive film is transferred to the substrate to be processed. As the transferring method, a hot press bonding method which comprises previously heating the substrate to be processed is desirable. A vacuum bonding method which achieves press boding under vacuum may also be adopted. Although the substrate to be processed can be arbitrarily chosen according to the usage of the photosensitive film aimed at. When it is used as a solder resist for a printed circuit board, for example, it is transferred to the printed circuit board having circuits previously formed thereon. When it is used as an interlaminar insulating layer for a build-up multi-layer printed circuit board, it is transferred to an inner board. Thereafter, in the case of the formation of a solder resist, the photosensitive film is selectively exposed to an actinic ray through a photomask having a prescribed pattern by a contact exposure method or non-contact exposure method and the unexposed areas of the film is removed by development with a dilute aqueous alkaline solution to form a resist pattern. Then, the film is further thermally cured by subjecting to the heat treatment at a temperature in the range of about 140 to200° C., for example.

As an aqueous alkaline solution to be used in the process of development mentioned above, aqueous alkaline solutions of sodium hydroxide, potassium hydroxide, sodium carbonate, potassium carbonate, sodium silicate, ammonia, organic amines, tetramethylammonium hydroxide, etc. can be used the concentration of an alkali in the developing solution may be proper generally in the range of 0.1 to 5.0 wt. %. As the developing method, various known methods such as dipping development, paddling development, and spraying development may be adopted.

The light sources which are properly used for the purpose of photo-curing the actinic energy ray-curable composition or the photocurable and thermosetting resin composition include a low-pressure mercury lamp, a medium-pressure mercury lamp, a high-pressure mercury lamp, an ultra-high-pressure mercury lamp, a xenon lamp, and a metal halide lamp, for example. Laser beams may also be utilized as the actinic ray for exposure. Further, electron beams, α-rays, β-rays, γ-rays, X-rays, neutron beams, etc. may be utilized.

Now, the present invention will be described more specifically below with reference to working examples. It should be noted, however, that the following Examples are intended to be merely illustrative of and in any sense restrictive of the present invention. Wherever the terms "parts" and "%" are used hereinbelow, they invariably refer to those based on weight unless otherwise specified.

EXAMPLES OF SYNTHESES OF ACTINIC
ENERGY RAY-CURABLE RESIN

Synthesis Example 1

Into a 200 ml four-necked flask equipped with a stirrer, a reflux condenser, and a thermometer, 36.2 g (0.1 mol) of terephthalate bisoxetane (manufactured by Ube Kosan K.K.), 17.2 g (0.2 mol) of methacrylic acid, 2.1 g (0.005 mol) of tetraphenylphosphonium bromide, and 0.1 g of methoquinone were charged and stirred with a magnet stirrer at 140° C. for 12 hours. After the decrease in absorption caused by the oxetane ring at 980 cm$^{-1}$ has been confirmed by IR spectrum and the reduction of the acid value to a level of not more than 20 mg KOH/g has been also confirmed, the temperature of the reaction mixture was lowered to 100° C. and then 18.0 g (0.18 mol) of succinic anhydride was added to the mixture. The mixture was further stirred at 100° C. for 3 hours. The product obtained had an acid value of 157 mg KOH/g.

The IR spectrum of the resin obtained is shown in the figure. It can be confirmed by the IR spectrum shown in the FIGURE that the absorption of the primary hydroxyl group and the acid anhydride disappeared and the broad absorption originated from the carboxyl group appeared. Therefore, it is confirmed that the ring opening addition of the acid anhydride to the modified oxetane resin was performed and the carboxyl groups were introduced into the resin. The resultant product was soluble in an aqueous 1% sodium carbonate solution.

Synthesis Example 2

Into a 200 ml four-necked flask equipped with a stirrer, a reflux condenser, and a thermometer, 33.4 g (0.1 mol) of xylylene bisoxetane (manufactured by To a Gosei K.K., product name "XDO"), 17.2 g (0.2 mol) of methacrylic acid, 2.1 g (0.005 mol) of tetraphenylphosphonium bromide, and 0.1 g of methoquinone were charged and stirred at 130° C. for 24 hours. After the reduction of the acid value to a level of not more than 20 mg KOH/g has been confirmed, the temperature of the reaction mixture was lowered to 100° C. and then 18.0 g (0.18 mol) of succinic anhydride was added to the mixture. The mixture was further stirred at 100° C. for 3 hours. The product obtained had an acid value of 147 mg KOH/g. The resultant product was soluble in an aqueous 1% sodium carbonate solution.

Synthisis Example 3

The synthesis was carried out by following the procedure of Synthesis Example 1, except that 27.4 g (0.18 mol) of tetrahydrophthalic anhydride was used in place of the acid anhydride. The product obtained had an acid value of 125 mg KOH/g. As a result of the measurement of IR spectrum of the product, the decrease in absorption caused by the oxetane ring at 980 cm$^{-1}$ was found and the broad absorption originated from the carboxyl group appeared. Therefore, it has been confirmed that the reaction aimed at proceeded properly. The resultant product was soluble in an aqueous 1% sodium carbonate solution. Hereinafter, this resin solution will be referred to as varnish "a".

Synthesis Example 4

The synthesis was carried out by following the procedure of Synthesis Example 2, except that 27.4 g (0.18 mol) of tetrahydrophthalic anhydride was used in place of the acid anhydride. The product obtained had an acid value of 147 mg KOH/g. As a result of the measurement of IR spectrum of the product, the decrease in absorption caused by the oxetane ring at 980 cm$^{-1}$ was found and the broad absorption originated from the carboxyl group appeared. Therefore, it has been confirmed that the reaction aimed at proceeded properly. The resultant product was soluble in an aqueous 1% sodium carbonate solution. Hereinafter, this resin solution will be referred to as varnish "b".

Synthesis Example 5

Into a 200 ml four-necked flask equipped with a stirrer, a reflux condenser, and a thermometer, 20.4 g of phenol novolak type oxetane (number of nuclei=7), 8.6 g of methacrylic acid, 2.1 9 of tetraphenylphosphonium bromide, 30 g of propylene glycol monomethyl ether acetate, and 0.1 g of methoquinone were charged and stirred at 140° C. for 24 hours. The temperature was lowered to 100° C. and then 9.2 g of tetrahydrophthalic anhydride was added to the mixture. The mixture was further stirred for 3 hours to obtain a resin solution containing 54% of actinic energy ray-curable resin. The resin solution obtained had an acid value of a solid content of 84 mg KOH/g Hereinafter, this resin solution will be referred to as varnish "c".

Synthesis Example 6

A mixture of 50.1 g of methyl methacrylate, 92.1 g of (3-ethyl-3-oxetanyl)methyl methacrylate, and 4.9 g of azobisisobutyronitrile was added dropwise to 142.2 g of propylene glycol monomethyl ether acetate heated to 80° C. in advance over a period of 2 hours and stirred at the same temperature for 8 hours to synthesize an oxetane ring-containing copolymeric resin. The number-average molecular weight of the copolymer determined by GPC was 12,000. To this resin solution, 44.5 g of methacrylic acid, 5.2 g of tetraphenylphosphonium bromide, and 0.4 g of methoquinone were added and the resultant mixture was stirred at 140° C. for 12 hours. The temperature was lowered to 100° C. and then 60.8 g of tetrahydrophthalic anhydride was added to the mixture. The mixture was further stirred at 100° C. for 3 hours to obtain the actinic energy ray-curable resin solution having an acid value of a solid content of 91 mg KOH/g. The resultant product was soluble in an aqueous 1% sodium carbonate solution. Hereinafter, this resin solution will be referred to as varnish "d".

Comparative Synthesis Example

Into a four-necked flask equipped with a stirrer and a reflux condenser, 220 g of cresol novolak type epoxy resin, "EPICLON N-695" (manufactured by Dainippon Ink and Chemicals Inc., epoxy equivalent: 220) was charged and then 220 g of carbitol acetate was added thereto and they were molten by heating. Then, 0.46 g of hydroquinone as a polymerization inhibitor and 1.38 g of triphenylphosphine as a reaction catalyst were added thereto. The resultant mixture was heated to 95–105° C., 72 g of acrylic acid was gradually added dropwise thereto, and they were left reacting for 16 hours. The resultant reaction product was cooled to 80–90° C., 106 g of tetrahydrophthalic anhydride was added thereto, and the mixture was left reacting for 8 hours and cooled, and then the reaction product was extracted therefrom.

The carboxyl group-containing photosensitive resin obtained as described above had a nonvolatile content of 64% and an acid value of a solid content of 97 mg KOH/g. Hereinafter, this reaction solution will be referred to as varnish "e".

EXAMPLES OF PHOTOCURABLE AND THERMOSETTING RESIN COMPOSITION

The raw materials used in the following working examples and comparative examples are shown in Table 1.

TABLE 1

| | Components | Chemical name or product name |
|---|---|---|
| Main agent | Photosensitive prepolymer | Varnish "a" obtained in Synthesis Example 3 |
| | | Varnish "b" obtained in Synthesis Example 4 |
| | | Varnish "c" obtained in Synthesis Example 5 |
| | | Varnish "d" obtained in Synthesis Example 6 |
| | | Varnish "e" obtained in Comparative Synthesis Example |
| | Filler | Silica |
| | Photopolymerization initiator | 2-Methyl-1-[4-(methylthio)phenyl]-2-morphorino-propan-1-one |
| | Coloring pigment | Phthalocyanine green |
| | Curing promotor a | Tetraphenyl phosphonium bromide |
| | Curing promotor b | Imidazol |
| | Diluent | Dipropylene glycol monomethyl ether |
| | Silicone-based anti-foaming agent | KS-66 (manufactured by Shinetsu Chemical Industries Co., Ltd.) |
| | Additive | Organobentonite |
| Hardener | Photopolymerizable monomer | Dipentaerythritol hexaacrylate |
| | Epoxy resin | TEPIC (manufactured by Nissan Chemical Industries Ltd.) |
| | Oxetane resin | Terephthalate bisoxetane (manufactured by Ube Kosan K.K.) |
| | Diluent | Dipropylene glycol monomethyl ether |

Examples 1–4 and Comparative Example

The main agent solution of each of the examples shown in Table 2 was prepared by compounding relevant components at proportions shown correspondingly in the same table and kneading them with a three-roll mill. The hardener solution of the same example was prepared similarly by compounding relevant components at proportions shown in Table 2 and kneading them with the three-roll mill. The photocurable and thermosetting resin compositions thus obtained in two liquid state were changed to one liquid state by mixing them and subjected to the following evaluation.

TABLE 2

| | | | Examples | | | | Comp. |
|---|---|---|---|---|---|---|---|
| Components and amounts (parts) | | | 1 | 2 | 3 | 4 | Example |
| Main agent | Varnish (solid content) | a | 100 | — | — | — | — |
| | | b | — | 100 | — | — | — |
| | | c | — | — | 100 | — | — |
| | | d | — | — | — | 100 | — |
| | | e | — | — | — | — | 100 |
| | Filler | | 30 | 30 | 30 | 30 | 30 |
| | Photopolymerization initiator | | 10 | 10 | 10 | 10 | 10 |

TABLE 2-continued

| | | | Examples | | | | Comp. |
|---|---|---|---|---|---|---|---|
| Components and amounts (parts) | | | 1 | 2 | 3 | 4 | Example |
| | Coloring pigment | | 1 | 1 | 1 | 1 | 1 |
| | Curing promotor | a | 3.5 | 3.5 | 3.5 | 3.5 | — |
| | | b | — | — | — | — | 0.5 |
| | Diluent | | 10 | 10 | 10 | 10 | 10 |
| | Silicone-based anti-foaming agent | | 1 | 1 | 1 | 1 | 1 |
| | Additive | | 5 | 5 | 5 | 5 | 5 |
| Hardener | Photopolymerizable monomer | | 20 | 20 | 20 | 20 | 20 |
| | Epoxy resin | | — | — | — | — | 30 |
| | Oxetane resin | | 30 | 30 | 30 | 30 | — |
| | Diluent | | 5 | 5 | 5 | 5 | 5 |

Evaluation of Quality (1) Storage Stability

The photocurable and thermosetting resin compositions prepared as described above in one liquid state was left standing at 50° C. for one week and their state at the end of the standing were examined to evaluate the storage stability. As a result, the resin composition of Comparative Example has solidified. On the contrary, the resin compositions of Examples 1 to 4. have maintained their liquid state without causing gelation. To be specific, this means that the resin compositions according to Examples 1–4 of the present invention excel in storage stability and can be formulated as a one package preparatin.

(2) Developability

The photocurable and thermosetting resin compositions obtained in Examples 1–4 which could keep the liquid state without causing gelation in the test for storage stability were each applied by the screen printing method onto the entire surface of a copper-clad substrate and then dried by heating at 80° C. for 30 minutes. Each substrate was entirely exposed to light through a negative film with a prescribed exposure dose and then developed with an aqueous 1 wt % $Na_2CO_3$ solution used as a developing solution under the condition of a spraying pressure of 2 kg/cm² for one minute to form a resist pattern thereon. The developability was visually examined through a microscope and rated on the following criterion.

⊙: Complete development even in very small portions
○: Presence of thin undevelopped portions in the substrate surface
Δ: Remarkable presence of undevelopped portions
X: Almost no development (3) Adhesiveness:

The photocurable and thermosetting resin compositions obtained in Examples 1–4 which could keep the liquid state without causing,gelation in the test for storage stability were each applied by the screen printing method onto the entire surface of a printed circuit board having a prescribed pattern formed in advance thereon to form a coating film of about 20 μm tickness. Then, a resin pattern was formed under the same conditions as in the test for developability in item (2) mentioned above. The resultant substrate was thermally cured at 180° C. for one hour to prepare a test substrate. This test substrate was incised like cross-cut in the shape of squares in a go board and then subjected to a peel test with a cellophane adhesive tape in accordance with the method specified in JIS D-0202 to determine the degree of separation of the resist layer based on the following criterion.

⊙: 100/100 and absolutely no peeling of the resist layer
○: 100/100, but slight peeling in cross-cut portions
Δ: 50/100–90/100
X: 0/100–50/100

(4) Resistance to Cracking

Test substrates were prepared under the same conditions as in the test for adhesiveness in item (3) mentioned above by using the photocurable and thermosetting resin compositions obtained in Examples 1–4 which could keep the liquid state without causing gelation in the test for storage stability. These test substrates were subjected to the heat cycle test under the conditions of 1,000 cycles between 125° C.×30minutes and −55° C.×30 minutes to investigate the occurrence of cracks.

(5) Resistance to Soldering Heat

Test substrates were prepared under the same conditions as in the test for adhesiveness in item (3) mentioned above by using the photocurable and thermosetting resin compositions obtained in Examples 1–4 which could keep the liquid state without causing gelation in the test for storage stability. Each of the test substrates was coated with a rosin type flux, immersed for 30 seconds in a solder bath set in advance at 260° C., then rinsed with isopropyl alcohol to remove the flux therefrom, and visually examined to find the extents of swelling, separation, and discoloration consequently produced in the resist layer on the test substrate.

⊙: Perfect absence of any discernible change was found.
○: Slight change was found.
Δ: Swelling or separation of a coating film was not more than 20%.
X: Swelling or separation of a coating film was not less than 20%.

The results of the above tests are collectively shown in Table 3.

TABLE 3

| Properties | Examples | | | |
|---|---|---|---|---|
| | 1 | 2 | 3 | 4 |
| Developability | ⊙ | ⊙ | ○ | ⊙ |
| Adhesiveness | ⊙ | ○ | ⊙ | ⊙ |
| Resistance to cracking | No cracks | No cracks | No cracks | No cracks |
| Resistance to soldering heat | ⊙ | ○ | ⊙ | ⊙ |

As being clear from the results shown in Table 3, the photocurable and thermosetting resin compositions of the present invention obtained in Examples 1–4 excelled in storage stability as compared with the conventional composition, were developable with an alkali solution, and exhibited good photo-curing properties. Further, it has been confirmed that cured films excelling in resistance to heat and resistance to cracking can be obtained after the subsequent thermal curing reaction. Incidentally, the insulation resistance measured was the same results as that obtained by the conventional cured film.

As described above, the actinic energy ray-curable resin of the present invention excels in thermal stability and resistance to heat and is soluble in an aqueous alkaline solution. Accordingly, the actinic energy ray-curable composition containing this resin as a curing component, particularly the photocurable and thermosetting resin composition containing this resin together with a polyfunctional oxetane compound as a thermosetting component excels in storage stability, cures promptly by short-time irradiation of an actinic energy ray, can be developed with an aqueous alkaline solution after exposure to light, and allows formation of a cured film excelling in various properties such as electrical insulating properties, resistance to heat, fastness of adhesion, and resistance to chemicals by the thermal curing of the coating film thereof after exposure to light and development, without causing any shrinkage on curing. It is therefore useful in various technical field as the materials of solder resists and etching resists to be used for the production of printed circuit boards, interlaminar insulating materials for build-up boards, plating resists, the photosensitive dry films, the production of fluorescent materials for DF and PDP, and the like.

While certain specific working examples have been disclosed herein, the invention may be embodied in other specific forms without departing from the spirit or essential characteristics thereof. The described examples are therefore to be considered in all respects as illustrative and not restrictive, the scope of the invention being indicated by the appended claims rather than by the foregoing description and all changes which come within the meaning and range of equivalency of the claims are, therefore, intended to be embraced therein.

What is claimed is:

1. A printed circuit board that includes a solder resist having a curable composition, said curable composition comprising:
(A) an actinic energy ray-curable resin which is obtained by causing the reaction of (a) an oxetane compound containing at least two oxetane rings with (b) an unsaturated monocarboxylic acid and the subsequent reaction of (c) a polybasic acid anhydride with a primary hydroxyl group of the resultant modified oxetane resin (a') and has at least one structure represented by the following general formula (1) and (B) a polymerization initiator:

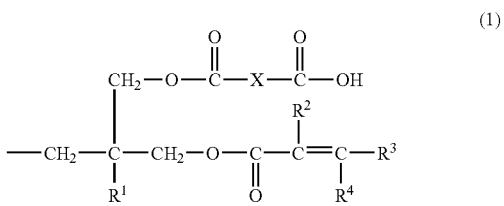

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

2. A printed circuit board that includes a solder resist formed through a photocurable and thermosetting resin composition, said photocurable and thermosetting resin comprising:
(A) an actinic energy ray-curable resin having at least one structure represented by the following general formula (1), (B) a polymerization initiator, (C) a diluent, and (D) an oxetane compound containing at least two oxetane rings in its molecule:

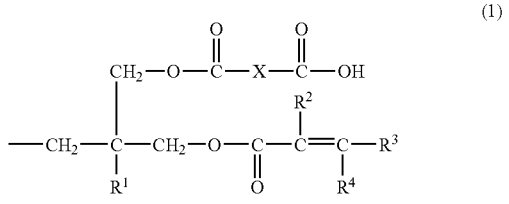

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

3. A multi-layer printed circuit board that includes an insulating layer formed between conductor circuit layers through a curable composition, the curable composition comprising:

(A) an actinic energy ray-curable resin which is obtained by causing the reaction of (a) an oxetane compound containing at least two oxetane rings with (b) an unsaturated monocarboxylic acid and the subsequent reaction of (c) a polybasic acid anhydride with a primary hydroxyl group of the resultant modified oxetane resin (a') and has at least one structure represented by the following general formula (1) and (B) a polymerization initiator:

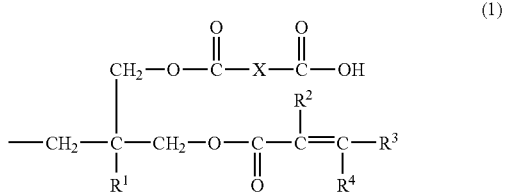

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

4. A multi-layer printed circuit board that includes an insulating layer formed between conductor circuit layers through a photocurable and thermosetting resin composition, said photocurable and thermosetting resin comprising:

(A) an actinic energy ray-curable resin having at least one structure represented by the following general formula (1), (B) a polymerization initiator, (C) a diluent, and (D) an oxetane compound containing at least two oxetane rings in its molecule:

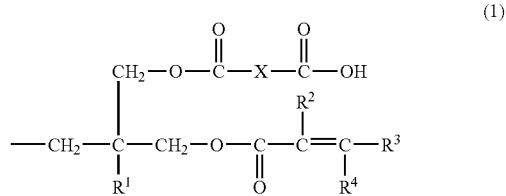

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

5. A photosensitive film that includes a support and a photosensitive layer consisting of a dry film having a photocurable and thermosetting resin composition, said photosensitive layer being formed on one surface of said support, and said photocurable and thermosetting resin comprising:

(A) an actinic energy ray-curable resin having at least one structure represented by the following general formula (1), (B) a polymerization initiator, (C) a diluent, and (D) an oxetane compound containing at least two oxetane rings in its molecule:

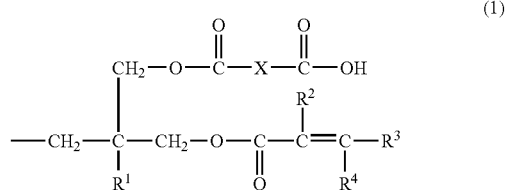

wherein $R^1$ represents a hydrogen atom or an alkyl group of 1 to 6 carbon atoms, $R^2$, $R^3$ and $R^4$ independently represent a hydrogen atom, an alkyl group of 1 to 6 carbon atoms, an aryl group, an aralkyl group, a cyano group, a fluorine atom, or a furyl group, and X represents a polybasic acid anhydride residue.

* * * * *